United States Patent
Cho

(10) Patent No.: US 7,354,828 B2
(45) Date of Patent: Apr. 8, 2008

(54) SEMICONDUCTOR DEVICE WITH INCREASED CHANNEL LENGTH AND METHOD FOR FABRICATING THE SAME

(75) Inventor: Jun-Hee Cho, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/323,639

(22) Filed: Dec. 29, 2005

(65) Prior Publication Data

US 2006/0220145 A1    Oct. 5, 2006

(30) Foreign Application Priority Data

Mar. 31, 2005    (KR) .................. 10-2005-0027366

(51) Int. Cl.
*H01L 21/336* (2006.01)
(52) U.S. Cl. .............. 438/270; 438/427; 438/589; 257/E21.429
(58) Field of Classification Search .......... 438/242, 438/270, 426, 427, 589; 257/E21.428, E21.429
See application file for complete search history.

(56) References Cited

U.S. PATENT DOCUMENTS 6,475,865 B1 * 11/2002 Yang et al. ............ 438/270

6,573,136 B1 * 6/2003 Hummler .............. 438/589

FOREIGN PATENT DOCUMENTS

| JP | 2004-186557 | 7/2004 |
|----|-------------|--------|
| KR | 10-0193896  | 2/1999 |

OTHER PUBLICATIONS

"80nm 512M DRAM with Enhanced Data Retention Time Using Partially-Insulated Cell Array Transistor (PiCAT)" by Kyoung Hwan Yeo, et al.; 2004 Symposium on VLSI Technology Digest of Technical Papers; 2004 *IEEE*; pp. 30-31.

* cited by examiner

*Primary Examiner*—Chandra Chaudhari
(74) *Attorney, Agent, or Firm*—Blakely, Sokoloff, Taylor & Zafman, LLP

(57) ABSTRACT

A semiconductor device includes a trench formed in a predetermined portion of a substrate and a first recess region beneath the trench. A field oxide layer is buried into both the trench and the first recess region. An active region is defined by the field oxide layer, having a first active region and a second active region. The latter has a second recess region formed in a lower portion of the active region than the former. A step gate pattern is formed on a border region between the first active region and the second active region. The gate pattern has a step structure whose one side extends to a surface of the first active region and the other side extends to a surface of the second active region. Other embodiments are also described.

14 Claims, 17 Drawing Sheets

SEMICONDUCTOR DEVICE WITH INCREASED CHANNEL LENGTH AND METHOD FOR FABRICATING THE SAME

FIELD OF THE INVENTION

An embodiment of the invention relates to semiconductor device fabrication technology and more particularly, to a semiconductor device with an increased channel length.

DESCRIPTION OF RELATED ARTS

Typically, in a dynamic random access memory (DRAM) cell structure having an N-channel metal-oxide semiconductor field-effect transistor (NMOSFET), it is very difficult to secure a refresh time due to an increase of an electric field that resulted from an increased boron concentration in a channel, as a design rule has been decreased.

Recently, as a DRAM device becomes highly integrated and technology with a feature size less than 70 nm has been developed, channel doping concentration of the device has been increased and thus, there are limitations in the form of increased electric field and junction leakage.

Furthermore, since a channel length and width are limited, and electron mobility is decreased due to the increased channel doping concentration, it is getting difficult to secure a sufficient channel current.

FIG. 1 is a cross-sectional view illustrating a conventional semiconductor device having a planar type NMOSFET.

As shown in FIG. 1, a plurality of field oxide layers 12 are formed in a substrate 11 through a shallow trench isolation (STI) process. A gate oxide layer 13 is formed on an active region of the substrate 11, and a planar type gate pattern PG is formed by sequentially stacking a gate electrode 14 and a gate hard mask 15 on the gate oxide layer 13. A plurality of N-type source/drain regions 16 are formed in the substrate 11 at both sides of the planar type gate pattern PG.

As described above, the conventional semiconductor device has the planar type NMOSFET including the planar type gate pattern PG formed on a flat surface of the substrate 11.

Since the conventional planar type transistor structure has a limitation in securing a required length and width of a channel at high integration, it is difficult to prevent a short channel effect.

Also, since the conventional semiconductor device has the field oxide layers 12 formed through the STI process, the field oxide layers 12 cannot prevent deep punchthrough between neighboring transistors.

SUMMARY OF THE INVENTION

An embodiment of the invention is a semiconductor device that may be capable of preventing a deep punchthrough between neighboring transistors and securing a length and a width of a channel with respect at high integration. A method for fabricating such a device is also described.

In accordance with one aspect of the present invention, there is provided a semiconductor device, including: a trench formed in a predetermined portion of a substrate and a first recess region beneath the trench; a field oxide layer buried into both of the trench and the first recess region; an active region defined by the field oxide layer, and having a first active region and a second active region having a second recess region formed in a lower portion than the first active region; and a step gate pattern on a border region between the first active region and the second active region, wherein the gate pattern has a step structure whose one side is extended to a surface of the first active region and the other side is extended to a surface of the second active region.

In accordance with another aspect of the present invention, there is provided a semiconductor device, including: a trench formed in a predetermined portion of a substrate and a first recess region beneath the trench, wherein a field oxide layer is buried into both of the trench and the first recess region; an active region defined by the field oxide layer and having a second recess region with a predecided depth; and a recess gate pattern whose lower portion is buried into the second recess region and upper portion is projected over a surface of the active region.

In accordance with further aspect of the present invention, there is provided a method for fabricating a semiconductor device, including: forming a trench in a device isolation region of a substrate in which the device isolation region and an active region are defined; forming a first recess region whose end points are extended to the active region at a bottom portion of the trench; forming a field oxide layer buried into both of the first recess region and the trench; forming a second recess region by etching a preset portion of the active region in a predecided depth, thereby providing a second active region whose height is lower than that of a first active region; and forming a gate pattern on a border region between the first active region and the second active region, wherein the gate pattern has a step structure whose one side is extended to a surface of the first active region and the other side is extended to a surface of the second active region.

In accordance with still further aspect of the present invention, there is provided with a method for fabricating a semiconductor device, including: forming a trench in a device isolation region of a substrate in which the device isolation region and an active region are defined; forming a first recess region whose end points are laterally extended to the active region at a bottom portion of the trench; forming a field oxide layer buried into both of the first recess region and the trench; forming a second recess region by etching a predetermined portion of the active region in a predecided depth; and forming a recess gate pattern whose bottom portion is buried into the second recess region and top portion is projected over a surface of the active region.

BRIEF DESCRIPTION OF THE DRAWINGS

The above features will become better understood with respect to the following description of the specific embodiments given in conjunction with the accompanying drawings, in which.

DETAILED DESCRIPTION OF THE INVENTION

Hereinafter, detailed descriptions of certain embodiments of the present invention will be provided with reference to the accompanying drawings.

A first embodiment of the present invention which will be explained hereinafter relates to a method for fabricating a semiconductor device having a step gated asymmetry recess (STAR) structure and a local oxidation isolation (LOI) structure, and a method for fabricating such a device.

Figure 1:
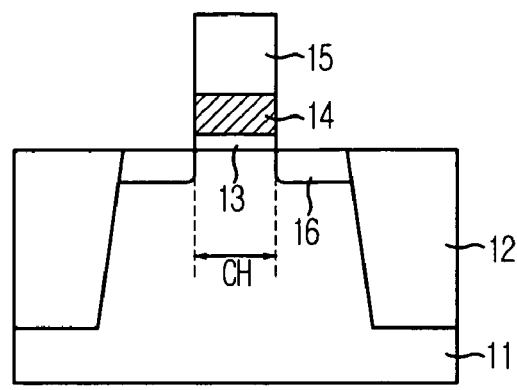
FIG. 1 is a cross-sectional view illustrating a conventional semiconductor device having a planar type N-channel metal-oxide semiconductor field-effect transistor (NMOSFET)
Figure 2:
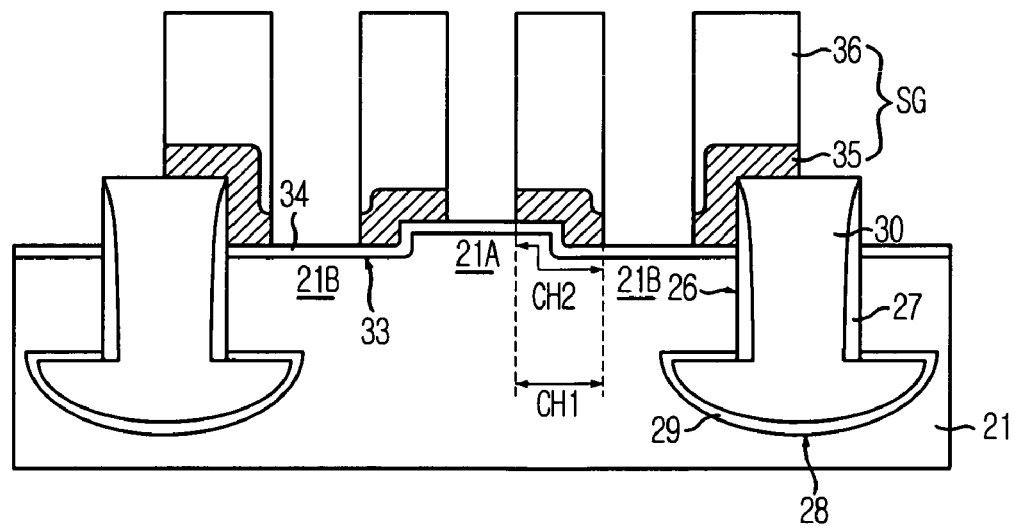
FIG. 2 is a cross-sectional view illustrating a structure of a semiconductor device in accordance with a first embodiment of the present invention.

FIG. 2 is a cross-sectional view illustrating a structure of a semiconductor device in accordance with the first embodiment of the present invention.

As shown in FIG. 2, the semiconductor device in accordance with the first embodiment of the present invention includes a plurality of field oxide layers 30 buried into a plurality of trenches 26 formed in predetermined portions of a substrate 21 and a plurality of first recess regions 28 beneath the trenches 26; an active region defined by the field oxide layers 30, and having a first active region 21A and a plurality of second recess regions 33 of a plurality of second active regions 21B formed lower than the first active region 21A; and a plurality of step gate patterns SG having step structures, where one side of the step gate patterns SG is formed on a surface of the first active region 21A and the other side of the step gate patterns SG is formed on surfaces of the second active regions 21B.

As shown in FIG. 2, the step gate patterns SG have structures formed by stacking a plurality of gate oxide layers 34, a plurality of gate electrodes 35 and a plurality of gate hard masks 36. A plurality of spacers 27 are formed on both sidewalls of the trenches 26 into which the field oxide layers 30 are buried, and a plurality of recess oxide layers 29 are formed on surfaces of the first recess regions 28 beneath the trenches 26.

In the semiconductor device as shown in FIG. 2, the field oxide layers 30 forming a device isolation structure are simultaneously buried into the trenches 26 formed through a shallow trench isolation (STI) process and the first recess regions 28 formed through a local oxidation isolation (LOI) process and thus, it is possible to prevent a deep punch-through between neighboring transistors and reduce parasitic capacitance.

A channel defined by each of the step gate patterns SG (hereinafter, referred to as a step channel) is extended compared to a channel length of a planar type transistor. That is, if the channel length of the planar type transistor is 'CH1', the channel length of the transistor in accordance with the first embodiment is 'CH2'. The 'CH2' is longer than the 'CH1' by as much as a depth of each of the second recess regions 33. By extending the channel length, a short channel effect is also prevented.

FIGS. 3A to 3F are cross-sectional views illustrating a method for fabricating a semiconductor device in accordance with the first embodiment of the present invention shown in FIG. 2.

Figure 3A:
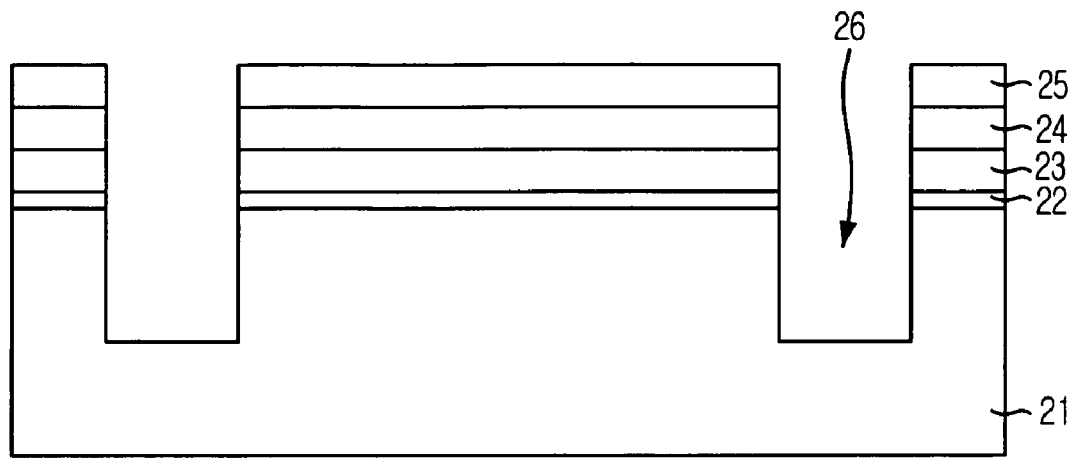
FIGS. 3A to 3F are cross-sectional views illustrating a method for fabricating the semiconductor device in accordance with the first embodiment of the present invention shown in FIG. 2.

As shown in FIG. 3A, a pad oxide layer 22 and a pad nitride layer 23 are sequentially deposited on a substrate 21. Herein, the substrate 21 is a cell region in which a memory device will be formed as a silicon substrate including a predetermined amount of impurities. The pad oxide layer 22 is formed in a thickness ranging from approximately 50 Å to approximately 150 Å, and the pad nitride layer 23 is formed in a thickness ranging from approximately 1,000 Å to approximately 2,000 Å.

Next, a first organic anti-reflective coating layer 24 which is an organic material is formed on the pad nitride layer 23. Afterwards, a photoresist layer is deposited on the first organic anti-reflective coating layer 24 and then, a plurality of shallow trench isolation (STI) masks 25 are formed by patterning the photoresist layer through an exposure process and a developing process. Herein, the photoresist layer used for the STI masks 25 uses a cyclo olefin-maleic anhydric (COMA) or acrylate based polymer material. The STI masks 25 are formed in a bar type or a T-type within two-dimensions.

Next, the first organic anti-reflective coating layer 24, the pad nitride layer 23, and the pad oxide layer 22 are sequentially etched by using the STI masks 25 as an etch barrier. Then, the substrate 21 exposed after the etch of the pad oxide layer 22 is continuously etched in a predetermined depth, thereby forming a plurality of trenches 26.

At this time, a depth of each of the trenches 26 ranges from approximately 1,000 Å to approximately 2,000 Å in consideration of a wet etching process and an oxidation process performed later.

Figure 3B:
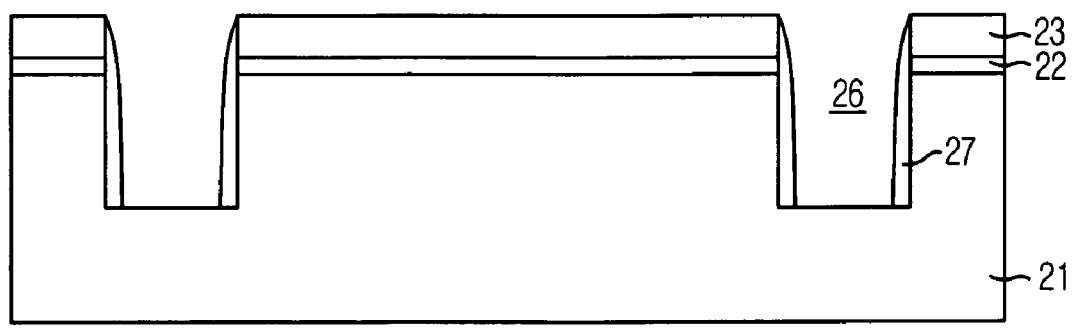

As shown in FIG. 3B, the STI masks 25 are stripped. At this time, the STI masks 25 are stripped by using oxygen plasma, and the first organic anti-reflective coating layer 24 which is of an organic material similar to the photoresist layer used for the STI masks 25 is simultaneously stripped.

Next, a plurality of spacers 27 covering sidewalls of the trenches 26 and sidewalls of stack patterns of the pad oxide layers 22 and the pad nitride layers 23 are formed.

At this time, regarding the formation of the spacers 27, a sidewall oxidation process, a liner nitride layer deposition process and a liner oxidation process are sequentially performed, thereby sequentially forming a sidewall oxide layer, a liner nitride layer and a liner oxide layer. Afterwards, a spacer etching process using an etch-back process is employed, thereby forming the spacers 27. Accordingly, the spacers 27 in this case have triple structures (not shown) made of the sidewall oxide layer, the liner nitride layer and the liner oxide layer. Since the spacers 27 are formed through the spacer etching process, bottom portions of the trenches 26 are opened.

Figure 3C:
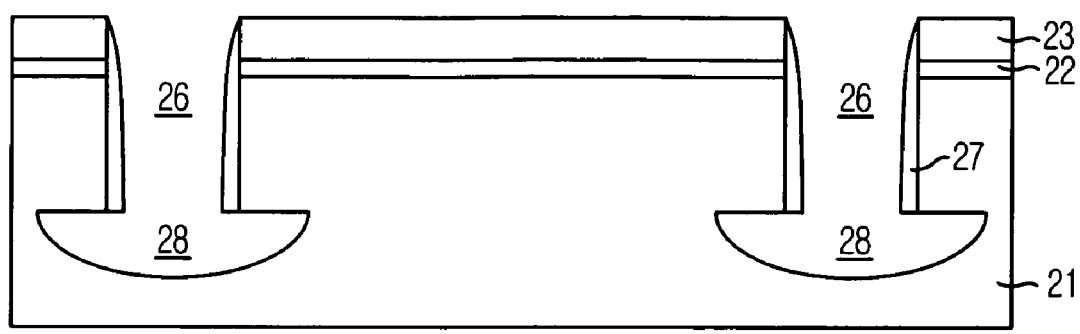

As shown in FIG. 3C, the opened bottom portions of the trenches 26 are subjected to an isotropic etching process by using the spacers 27 as an etch barrier, thereby forming a plurality of first recess regions 28. For instance, the bottom portions of the trenches 26 are subjected to the isotropic etching process by using the spacers 27 and the pad nitride layer 23 as an etch barrier with use of a mixed gas of hydrogen chloride (HCl) and hydrogen ($H_2$), thereby forming the first recess regions 28 as round types.

At this time, the first recess regions 28 are formed through the first isotropic etching process. Thus, both end points of the first recess regions 28 reach bottom portions of the spacers 27. That is, the first recess regions 28 have lateral etch types and thus, the first recess regions 28 have semi-circular types of round shapes in which the first recess regions 28 are extended to lateral sides beneath the trenches 26.

Regarding the etching process for forming the first recess regions 28, an etching speed or an etch profile is controlled at a pressure ranging from approximately 2 torr to approximately 200 torr, for a period ranging from approximately 0.5 minutes to approximately 60 minutes, by using a flowing quantity of HCl ranging from approximately 0.1 slm to approximately 1 slm and a flowing quantity of $H_2$ ranging from approximately 10 slm to approximately 50 slm, and at a temperature ranging from approximately 700° C. to approximately 1,000° C. Before performing the etching process, impurities on surfaces are removed by employing a pre-annealing process at a temperature ranging from approximately 800° C. to approximately 1,000° C. in a hydrogen gas atmosphere.

Figure 3D:
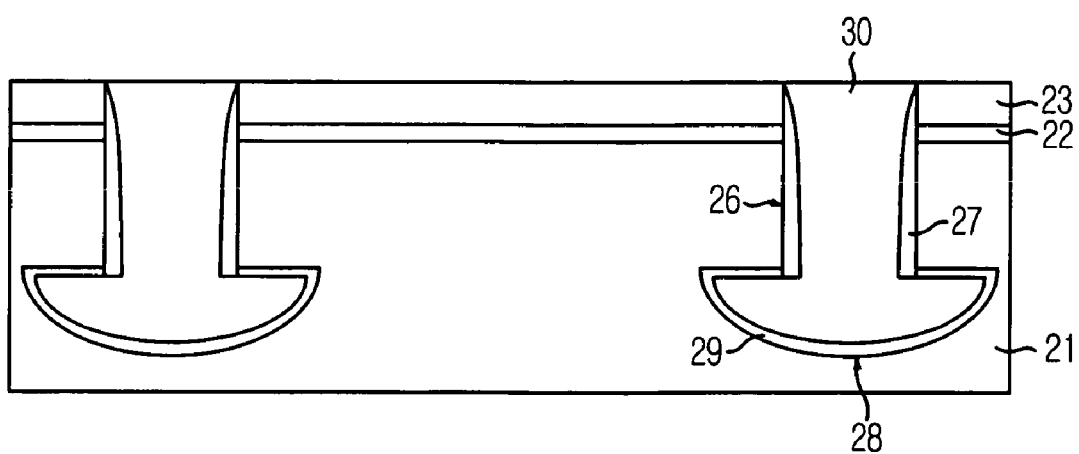

As shown in FIG. 3D, surfaces of the first recess regions 28 are subjected to a wet etching process, thereby forming a plurality of recess oxide layers 29. At this time, the recess oxide layers 29 serves a role in recovering a lattice defect resulted from a stress due to plasma during the etching process for forming the first recess regions 28. Typically, the recess oxide layers 29 plays an identical role as a side wall oxide layer used for a STI process.

As described above, the process of forming the first recess regions 28 beneath the trenches 26 and the recess oxide layers 29 is called a local oxidation isolation (LOI) process.

Next, a plurality of gap fill oxide layers filling both the first recess regions 28 and the trenches 26 are deposited and then, a CMP process is performed. Thus, a plurality of field oxide layers 30 are formed.

As a result, the STI process and the LOI process are employed to form a device isolation structure for forming the field oxide layers 30 in accordance with the first embodiment of the present invention.

Figure 3E:
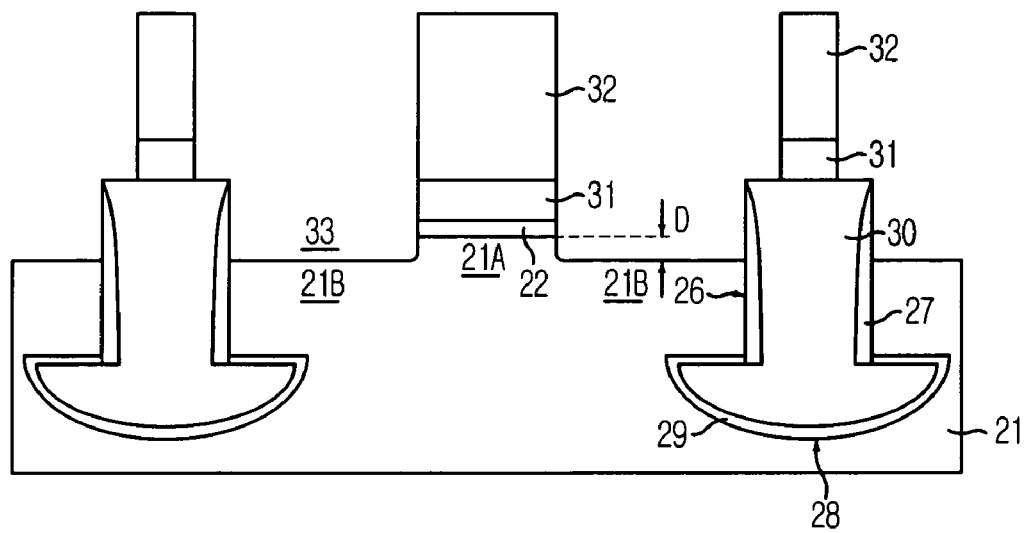

As shown in FIG. 3E, the pad nitride layer 23 is selectively stripped by using a phosphoric acid ($H_3PO_4$) solution and afterwards, a second organic anti-reflective coating layer 31 is formed on a surface including the pad oxide layer 22 in a state which the pad oxide layer 22 remains. Herein, the second organic anti-reflective coating layer 31 is formed by using an organic material.

Next, a photoresist layer is deposited on the second organic anti-reflective layer 31 and then, the photoresist layer is patterned through an exposure process and a developing process, thereby forming a plurality of STAR masks 32. Herein, the photoresist layer for forming the STAR masks 32 is a COMA or acrylate based polymer material.

Next, the second organic anti-reflective coating layer 31 is etched by using the STAR masks 32 as an etch barrier and then, the pad oxide layer 22 is continuously etched, thereby opening predetermined surfaces of the substrate 21.

Next, the predetermined surfaces of the substrate 21, exposed after the etching process subjected to the pad oxide layer 22 by using the STAR masks 32 as an etch barrier, is etched in a predetermined depth and then, a plurality of second recess regions 33 for step channels are formed. At this time, the etching process for forming the second recess regions 33 is employed by using a mixed gas of hydrogen bromide (HBr), chlorine ($Cl_2$) and oxygen ($O_2$).

As described above, if the second recess regions 33 are formed, the substrate 21 is divided into a first active region 21A of which a surface is higher than those of a plurality of second active regions 21B, and the surfaces of the second active regions 21B are lower than that of the first active region 21A. In a DRAM structure, the first active region 21A is an active region to which a bit line will be connected, and the second active regions 21B are active regions to which a storage node will be connected. Thus, the active regions have an asymmetric structure.

It is preferable that a recessed depth D of the second recess regions 33 ranges from approximately 200 Å to approximately 600 Å.

Figure 3F:
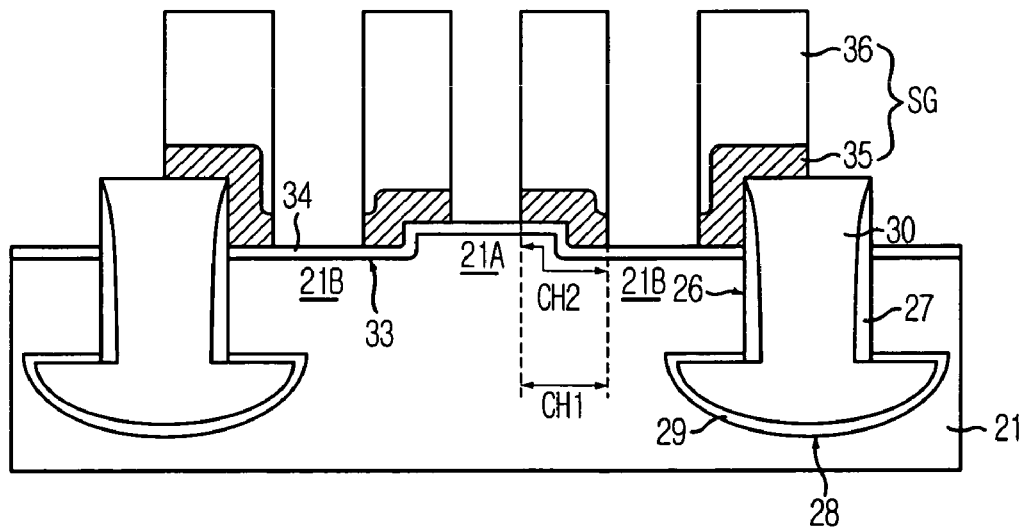

As shown in FIG. 3F, the STAR masks 32 and the second organic anti-reflective coating layers 31 are simultaneously stripped, and the pad oxide layer 22 is continuously removed.

Next, an ion-implantation process for controlling a threshold voltage is employed into an entire surface of the resulting structure. At this time, although the ion-implantation process for controlling the threshold voltage is not shown, the ion-implantation process is performed in a state which a sacrificial oxide layer or a screen oxide layer is formed through a dry oxidation process at a temperature ranging from approximately 800° C. to approximately 1,000° C. The sacrificial oxide layer is stripped after the ion-implantation process.

Next, after the sacrificial oxide layer is stripped, a gate oxide layer pre-cleaning process is performed. Then, a gate oxide layer 34 is formed on an entire surface of the resulting structure. At this time, the gate oxide layer 34 is formed in a thickness ranging from approximately 100 Å to approximately 150 Å through a dry oxidation process at a temperature ranging from approximately 850° C. to approximately 1,000° C.

Next, a plurality of step gate patterns SG formed by stacking a plurality of gate electrodes 35 and gate hard masks 36 on the gate oxide layer 34. Herein, a plurality of conductive layers for the gate electrodes 35 and a plurality of insulation layers for the gate hard masks 36 are stacked and then, the step gate patterns SG are formed through a gate mask process and an etching process.

As described above, the step gate patterns SG are called step gates since each of the step gate patterns SG is extended from a predetermined portion of the first active region 21A to a predetermined portion of each of the second active regions 21B, wherein the first active region 21A and the second active region 21B have a height difference.

For instance, one side of each of the step gate patterns SG is formed on a surface of each of the second active regions 21B having a lower height due to each of the second recess regions 33, and the other side of each of the step gate patterns SG is formed on a surface of the first active region 21A having a greater height due to each of the second recess region 33. Since each of the step gate patterns SG is formed on a border surface of the first active region 21A and each of the second active regions 21B, each of the step gate patterns SG has a step structure instead of a planar structure.

The step gate patterns SG are formed by being extended from the first active region 21A and the second active regions 21B having a height difference, thereby having a step structure. Thus, a step channel defined by the step gate patterns SG is longer than the step channel of the planar type transistor.

That is, if the step channel of the planar type transistor is 'CH1', the step channel of the transistor in accordance with the first embodiment is 'CH2'. The 'CH2' is longer than the 'CH1' as much as the recessed depth D of the second recess regions 33. By lengthening the step channel, a short channel effect is prevented.

In accordance with the first embodiment of the present invention, the device isolation structure is formed by using the STI process and the LOI process, and thus, it is possible to prevent a deep punchthrough between neighboring transistors and reduce parasitic capacitance.

A second embodiment of the present invention which will be explained hereinafter relates to a semiconductor device using a recess channel array transistor (RCAT) structure and a local oxidation isolation (LOI) structure, and a method for fabricating the same.

Figure 4:
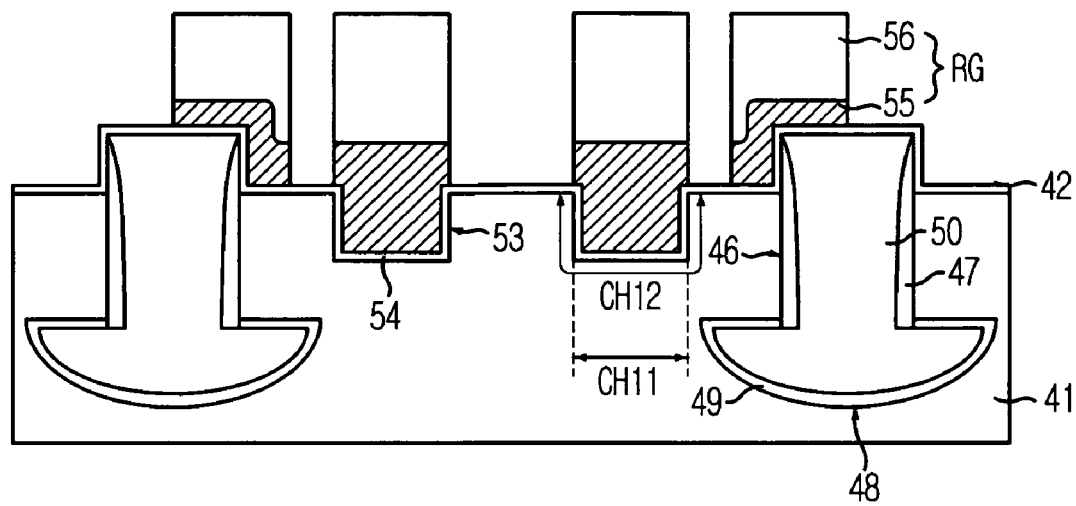
FIG. 4 is a cross-sectional view illustrating a structure of a semiconductor device in accordance with a second embodiment of the present invention.

FIG. 4 is a cross-sectional view illustrating a structure of a semiconductor device in accordance with the second embodiment of the present invention.

As shown in FIG. 4, the semiconductor device in accordance with the second embodiment of the present invention includes a plurality of field oxide layers 50 buried into a plurality of trenches 46 formed in predetermined portions of the substrate and a plurality of first recess regions 48 beneath the trenches 46; an active region defined by the field oxide layers 50, and having a plurality of second recess regions 53 with a predetermined depth; and a plurality of recess gate patterns RG of which bottom portions are buried into the second recess regions 53 and top portions that project above a surface of the active region.

As shown in FIG. 4, the recess gate patterns RG have stack structures formed sequentially stacking a gate oxide layer 54, a plurality of gate electrodes 55, and a plurality of gate hard masks 66. A plurality of spacers 47 are formed on sidewalls of the trenches 46 into which the field oxide layers 50 are buried, and a plurality of recess oxide layers 49 are formed on surfaces of the first recess regions 48 beneath the trenches 46.

In the semiconductor device as shown in FIG. 4, the field oxide layers 50 forming a device isolation structure are simultaneously buried into the trenches 46 due to a STI process and the first recess regions 48 due to a LOI process and thus, it is possible to prevent a deep punchthrough between neighboring transistors and reduce parasitic capacitance.

Since the recess gate patterns RG have structures of which predetermined portions are buried into the second recess regions 53, a channel defined by the recess gate patterns RG (hereinafter, referred to as a recess channel) has a greater length than a channel length of a planar type transistor. If a channel length of the planar type transistor is 'CH11', a channel length of the recess channel is 'CH22'. The 'CH22' is longer than the 'CH11' by as much as a recessed depth of the second recess regions 53. By extending the channel length, a short channel effect is prevented.

FIGS. 5A to 5F are cross-sectional views illustrating a method for fabricating the semiconductor device in accordance with the second embodiment of the present invention as shown in FIG. 4.

Figure 5A:
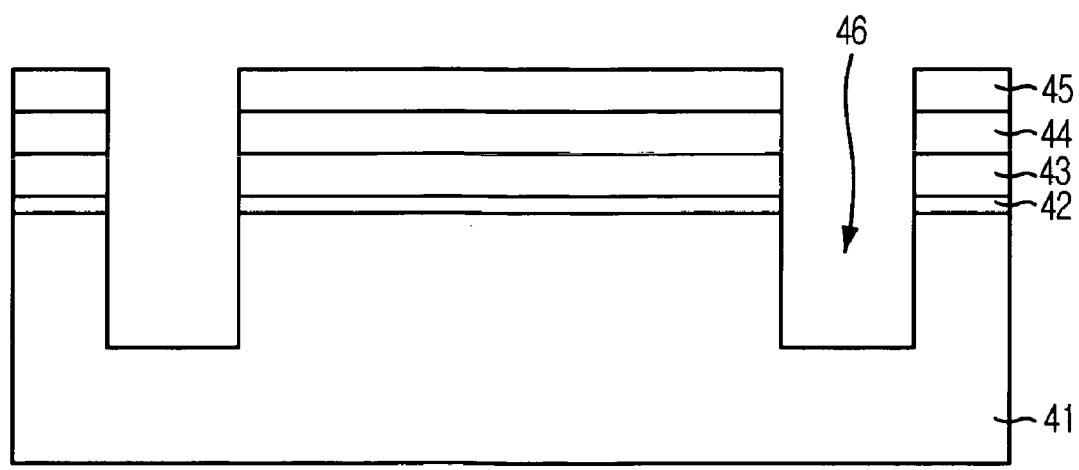
FIGS. 5A to 5F are cross-sectional views illustrating a method for fabricating the semiconductor device in accordance with the second embodiment of the present invention shown in FIG. 4.

As shown in FIG. 5A, a pad oxide layer 42 and a pad nitride layer 43 are sequentially deposited on a substrate 41. Herein, the substrate 41 is a cell region in which a memory device will be formed as a silicon substrate including a predetermined amount of impurities. The pad oxide layer 42 is formed in a thickness ranging from approximately 50 Å to approximately 150 Å, and the pad nitride layer 43 is formed in a thickness ranging from approximately 1,000 Å to approximately 2,000 Å.

Next, a first organic anti-reflective coating layer 44 which is an organic material is formed on the pad nitride layer 43. Afterwards, a photoresist layer is deposited on the first organic anti-reflective coating layer 44 and then, a plurality of shallow trench isolation (STI) masks 45 are formed by patterning the photoresist layer through an exposure process and a developing process. Herein, the photoresist layer used for the STI masks 45 uses a cyclo olefin-maleic anhydric (COMA) or acrylate based polymer material. The STI masks 45 are formed in a bar type or a T-type within two-dimensions.

Next, the first organic anti-reflective coating layer 44, the pad nitride layer 43, and the pad oxide layer 42 are sequentially etched by using the STI masks 45 as an etch barrier. Then, the substrate 41 exposed after the etch of the pad oxide layer 42 is continuously etched in a predetermined depth, thereby forming a plurality of trenches 46.

At this time, a depth of each of the trenches 26 ranges from approximately 1,000 Å to approximately 2,000 Å in consideration of a wet etching process and an oxidation process performed later.

Figure 5B:
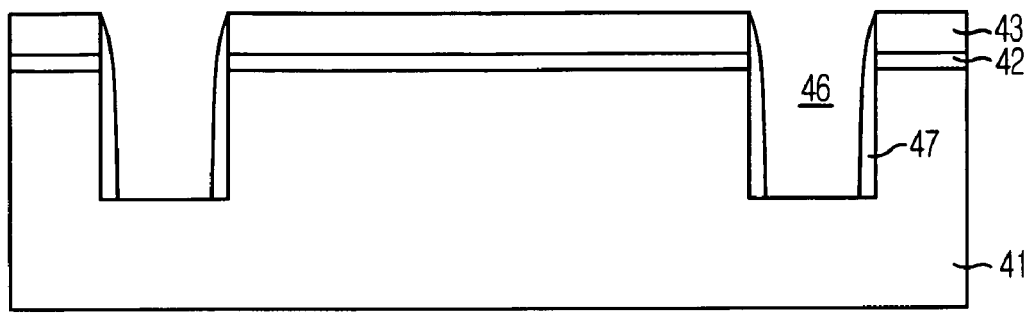

As shown in FIG. 5B, the STI masks 45 are stripped. At this time, the STI masks 45 are stripped by using oxygen plasma, and the first organic anti-reflective coating layer 44 which is an organic material similar to the photoresist layer used for the STI masks 45 is simultaneously stripped.

Next, a plurality of spacers 47 covering sidewalls of the trenches 46 and sidewalls of stack patterns of the pad oxide layers 42 and the pad nitride layers 43 are formed.

At this time, regarding the formation of the spacers 47, a sidewall oxidation process, a liner nitride layer deposition process and a liner oxidation process are sequentially performed, thereby sequentially forming a sidewall oxide layer, a liner nitride layer and a liner oxide layer. Afterwards, a spacer etching process using an etch-back process is employed, thereby forming the spacers 47. Accordingly, the spacers 47 have triple structures (not shown) of the sidewall oxide layer, the liner nitride layer and the liner oxide layer. Since the spacers 47 are formed through the spacer etching process, bottom portions of the trenches 46 are opened.

Figure 5C:
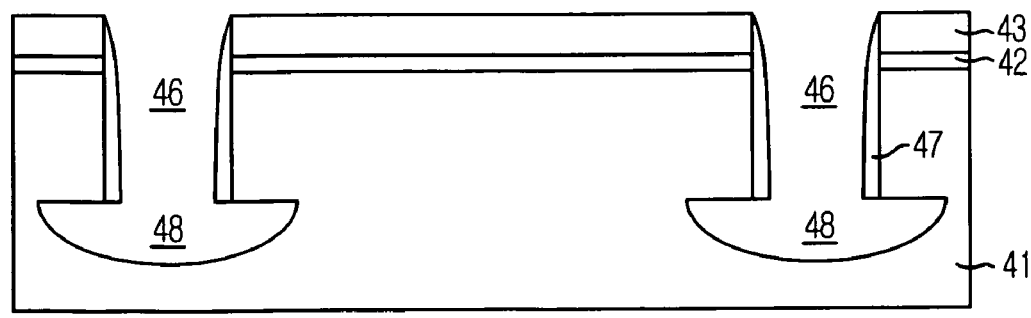

As shown in FIG. 5C, the opened bottom portions of the trenches 46 are subjected to an isotropic etching process by using the spacers 47 as an etch barrier, thereby forming a plurality of first recess regions 48. For instance, the bottom portions of the trenches 46 are subjected to the isotropic etching process by using the spacers 47 and the pad nitride layer 43 as an etch barrier with use of a mixed gas of hydrogen chloride (HCl) and hydrogen ($H_2$), thereby forming the first recess regions 28 with round types.

At this time, the first recess regions 48 are formed through the first isotropic etching process. Thus, both end points of the first recess regions 48 reach bottom portions of the spacers 47. That is, the first recess regions 48 have lateral etch types and thus, the first recess regions 48 have semi-circular types of round shapes where the first recess regions 48 are extended to lateral sides beneath the trenches 46.

In greater detail, regarding the etching process for forming the first recess regions 48, an etching speed or an etch profile is controlled at a pressure ranging from approximately 2 torr to approximately 200 torr, for a period ranging from approximately 0.5 minutes to approximately 60 minutes, by using a flowing quantity of HCl ranging from approximately 0.1 slm to approximately 1 slm and a flowing quantity of $H_2$ ranging from approximately 10 slm to approximately 50 slm, and at a temperature ranging from approximately 700° C. to approximately 1,000° C. Before performing the etching process, impurities on surfaces are removed by employing a pre-annealing process at a temperature ranging from approximately 800° C. to approximately 1,000° C. in a hydrogen gas atmosphere.

Figure 5D:
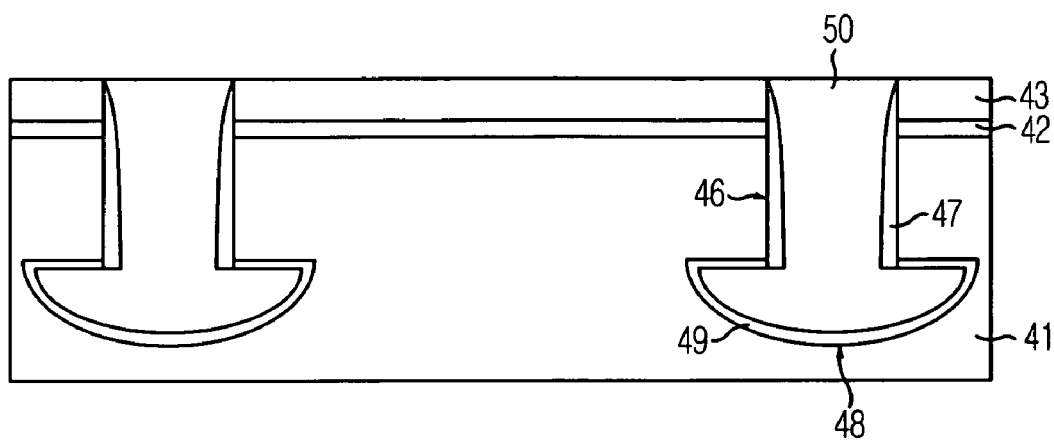

As shown in FIG. 5D, surfaces of the first recess regions 28 are subjected to a wet etching process, thereby forming a plurality of recess oxide layers 49. At this time, the recess oxide layers 49 serves a role in recovering a lattice defect resulted from a stress due to plasma during the etching process for forming the first recess regions 48. Typically, the recess oxide layers 49 play an identical role as a side wall oxide layer used for a STI process.

As described above, the process of forming the first recess regions 48 beneath the trenches 46 and the recess oxide layers 49 is called a local oxidation isolation (LOI) process.

Next, a plurality of gap fill oxide layers filling both the first recess regions 48 and the trenches 46 are deposited and then, a CMP process is performed. Thus, a plurality of field oxide layers 50 are formed.

As a result, the STI process and the LOI process are employed to form a device isolation structure for forming the field oxide layers 50 in accordance with the second embodiment of the present invention.

Figure 5E:
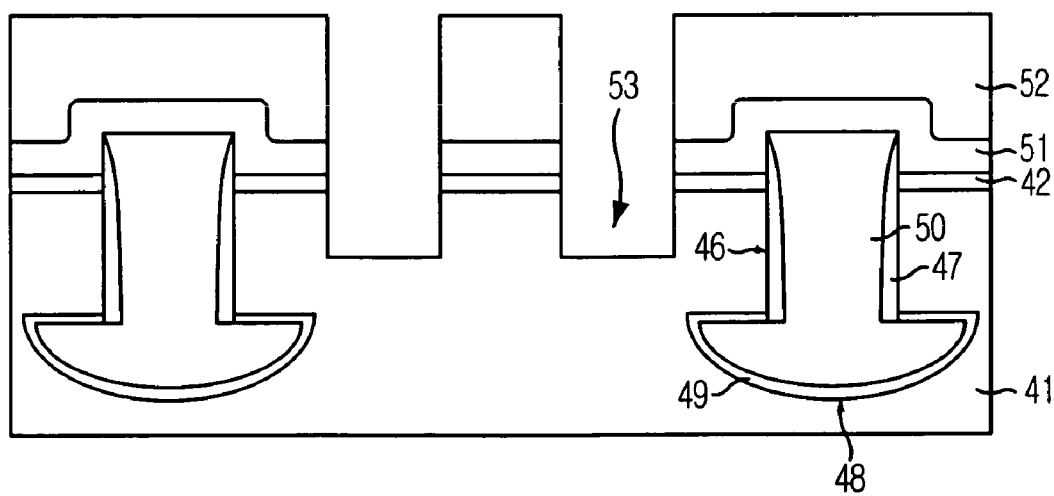

As shown in FIG. 5E, the pad nitride layer 43 is selectively stripped by using a phosphoric acid ($H_3PO_4$) solution and afterwards, a second organic anti-reflective coating layer 51 is formed on a surface including the pad oxide layer 42 in a state which the pad oxide layer 42 remains. Herein, the second organic anti-reflective coating layer 51 is formed by using an organic material.

Next, a photoresist layer is deposited on the second organic anti-reflective layer 51 and then, the photoresist layer is patterned through an exposure process and a developing process, thereby forming a plurality of RCAT masks 52. Herein, the photoresist layer for forming the RCAT masks 52 is a COMA or acrylate based polymer material.

Next, the second organic anti-reflective coating layer 51 is etched by using the RCAT masks 52 as an etch barrier and then, the pad oxide layer 42 is continuously etched, thereby opening predetermined surfaces of the substrate 41.

Next, the predetermined surfaces of the substrate 41, exposed after the etching process subjected to the pad oxide layer 42 by using the RCAT masks 52 as an etch barrier, are etched in a predetermined depth and then, a plurality of second recess regions 53 for step channels are formed. At this time, the etching process for forming the second recess regions 53 uses a mixed gas of HBr, $Cl_2$ and $O_2$.

It is preferable that a recessed depth D of the second recess regions 53 ranges from approximately 200 Å to approximately 600 Å.

Figure 5F:
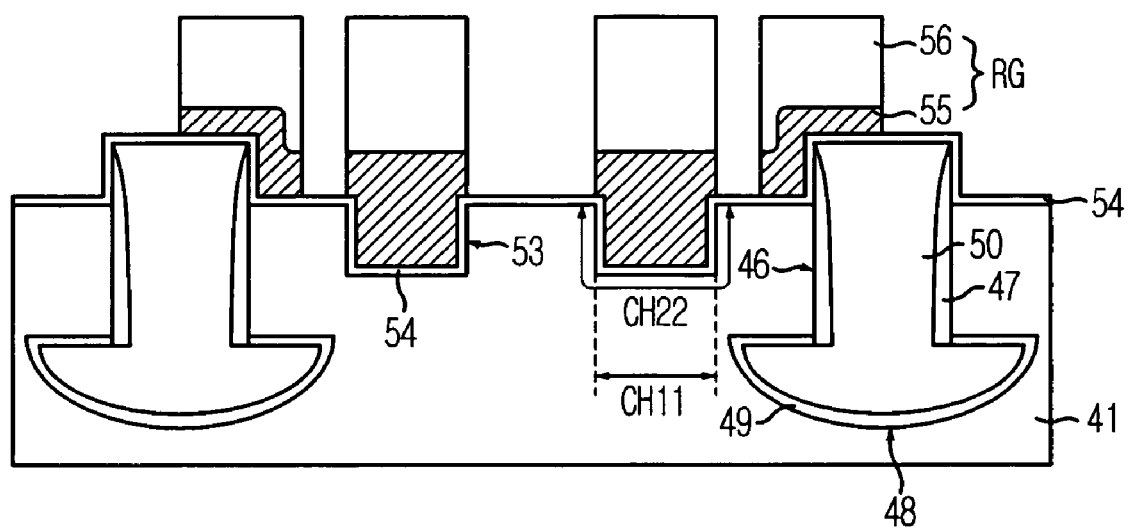

As shown in FIG. 5F, the RCAT masks 52 and the second organic anti-reflective coating layers 51 are simultaneously stripped, and the pad oxide layer 42 is continuously removed.

Next, an ion-implantation process for controlling a threshold voltage is applied onto an entire surface of the resulting structure. At this time, although the ion-implantation process for controlling the threshold voltage is not shown, the ion-implantation process is performed in a state which a sacrificial oxide layer or a screen oxide layer is formed through a dry oxidation process at a temperature ranging from approximately 800° C. to approximately 1,000° C. The sacrificial oxide layer is stripped after the ion-implantation process.

Next, after the sacrificial oxide layer is stripped, a gate oxide layer pre-cleaning process is performed. Then, a gate oxide layer 54 is formed on an entire surface of the resulting structure. At this time, the gate oxide layer 54 is formed in a thickness ranging from approximately 100 Å to approximately 150 Å through a dry oxidation process at a temperature ranging from approximately 850° C. to approximately 1,000° C.

Next, a plurality of recess gate patterns RG of which bottom portions are buried into the second recess regions 53 and top portions project above a surface of the substrate 41 are formed by stacking a plurality of gate electrodes 55 and a plurality of gate hard masks 56 on the gate oxide layer 54. Herein, a plurality of conductive layers for the gate electrodes 55 and a plurality of insulation layers for the gate hard masks 55 are stacked and then, a gate mask process and an etching process are employed, thereby forming the recess gate patterns RG.

Since the recess gate patterns RG have structures of predetermined portions that are buried into the second recess regions 53, a recess channel defined by the recess gate patterns (RG) becomes longer than a channel length of the planar type transistor.

That is, if the channel length of the planar type transistor is 'CH11', a length of the recess channel of the transistor in accordance with the second embodiment of the present invention is 'CH22'. The 'CH22' is longer that the 'CH11' by as much as the recessed depth D of the second recess regions 53. By increasing the channel length, a short channel effect is prevented.

Also, in accordance with the second embodiment of the present invention, the device isolation structure is formed by employing both the STI process and the LOI process and thus, it is possible to prevent a deep punchthrough between neighboring transistors and reduce parasitic capacitance.

Figure 6:
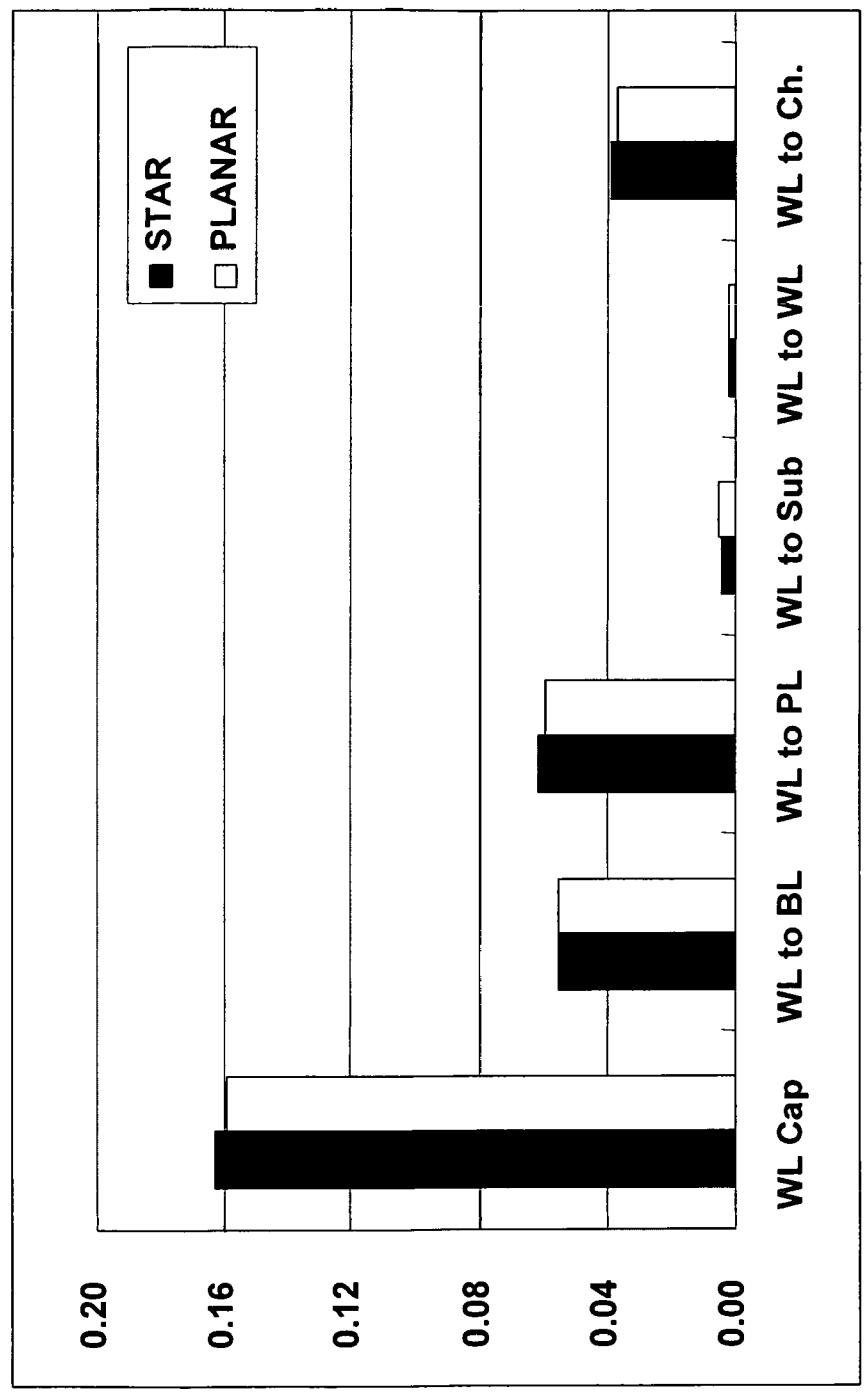
FIG. 6 is a graph exhibiting comparison results of word line capacitance between a step gated asymmetric recess (STAR) type cell and a conventional planar type cell.

FIG. 6 is a graph exhibiting comparison results of word line capacitance between a STEP type cell and a conventional planar type cell;

It is shown that the word line capacitance of the STAR type cell is higher than that of the conventional planar type cell.

Figure 7:
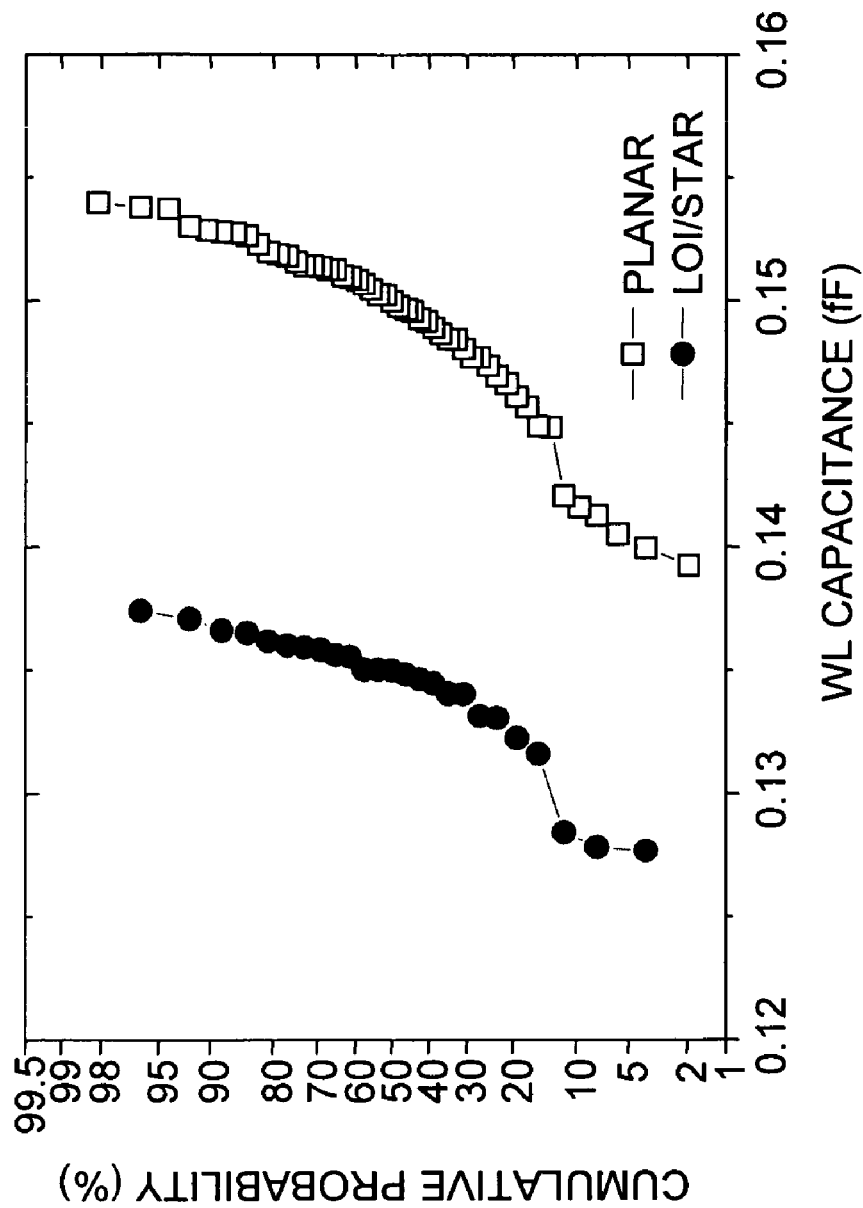
FIG. 7 is a graph exhibiting comparison results of word line capacitance between a STAR type cell employing a local oxidation isolation (LOI) structure and a conventional planar type cell.

FIG. 7 is a graph exhibiting comparison results of word line capacitance between a STAR type cell employing a LOI structure and a conventional planar type cell.

It is shown that the word line capacitance of the STAR type cell employing the LOI structure is much lower than that of the conventional planar type cell.

On the basis of FIGS. 6 and 7, in case of simply employing the STAR type cell, the word line parasitic capacitance is increased compared with that of the conventional planar type cell. However, in case of using the STAR cell simultaneously employing the LOI structure simultaneously, the word line parasitic capacitance is decreased compared with that of the conventional planar type cell.

Figure 8A:
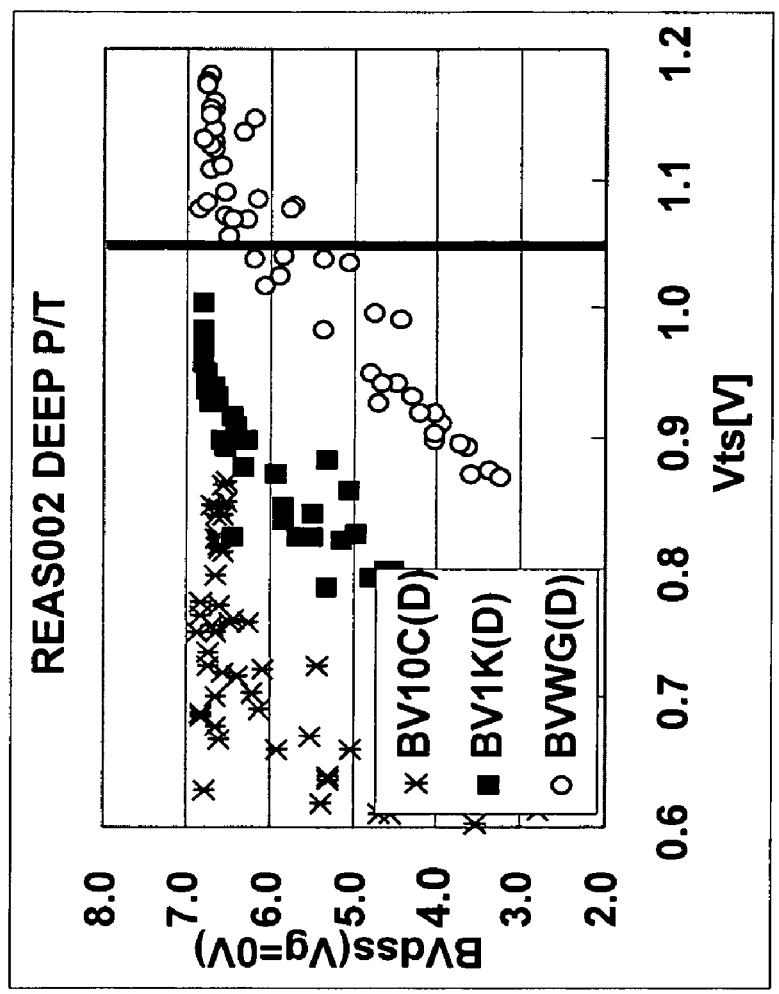
FIGS. 8A to 8C are graphs exhibiting a punchthrough property of devices employing different cell structures.
Figure 8B:
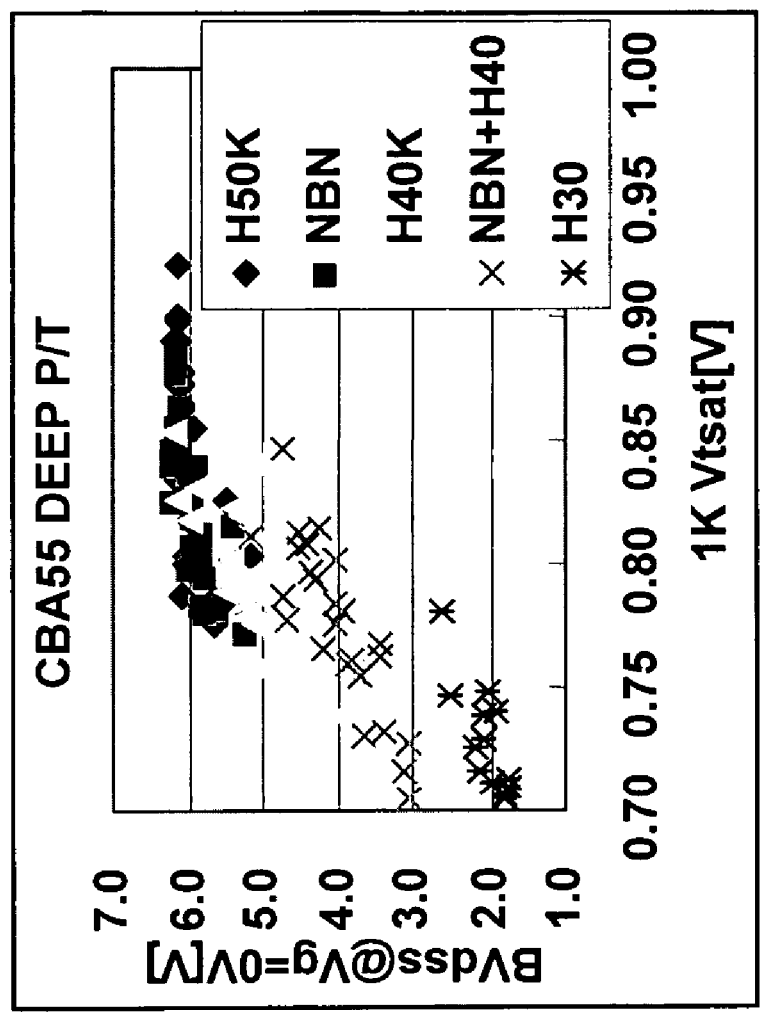
Figure 8C:
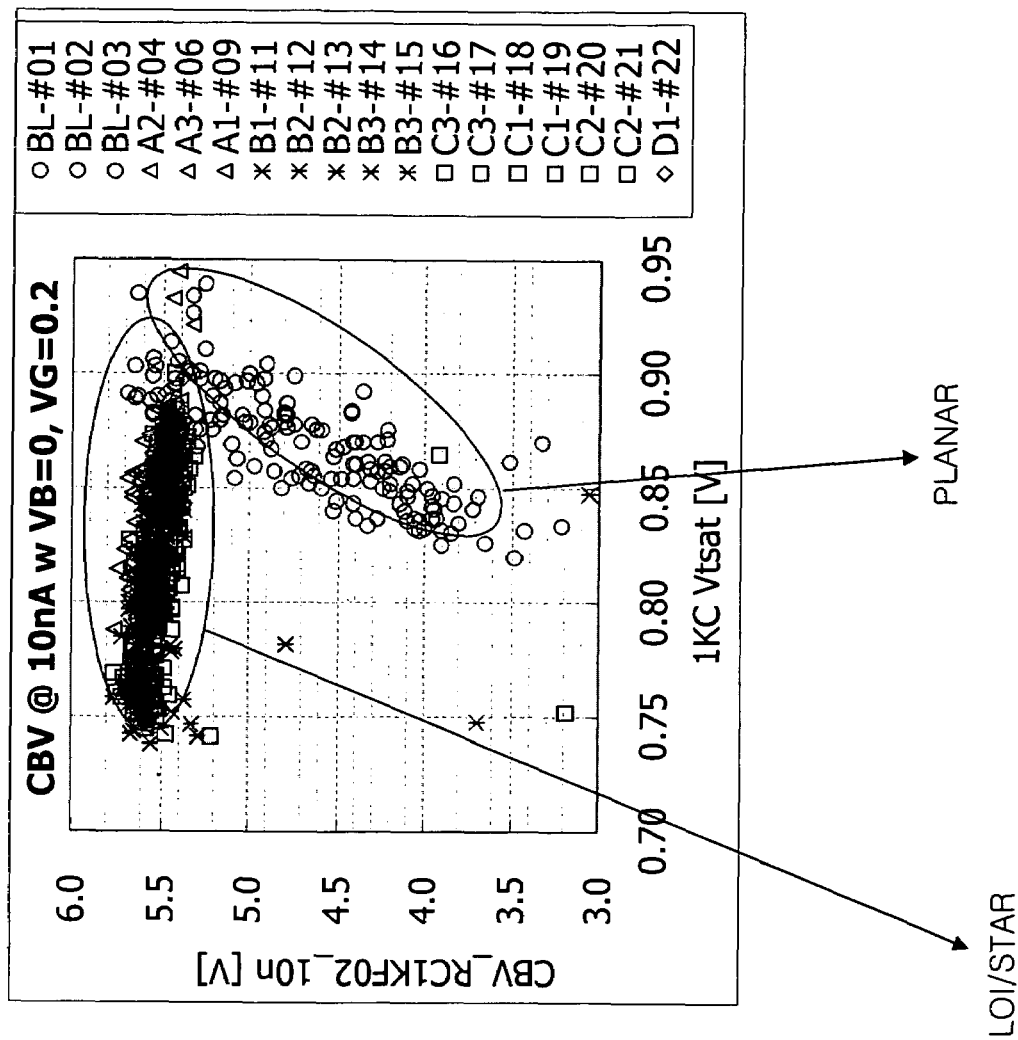

FIGS. 8A to 8C are graphs exhibiting a deep punchthrough property of devices employing different cell structures. FIG. 8A shows the deep punchthrough property of a STAR type cell. FIG. 8B shows the deep punchthrough property of a conventional planar type cell. FIG. 8C shows the deep punchthrough property of a STAR type cell simultaneously employing a LOI structure.

Referring to FIGS. 8A to 8C, in the case of embodying only the STAR type cell, the deep punchthrough property is very poor compared to the case of embodying the planar type cell. However, in the case of embodying the STAR type cell simultaneously employing the LOI structure, the deep punchthrough is not generated even at a threshold voltage of approximately 0.75V.

Figure 9A:
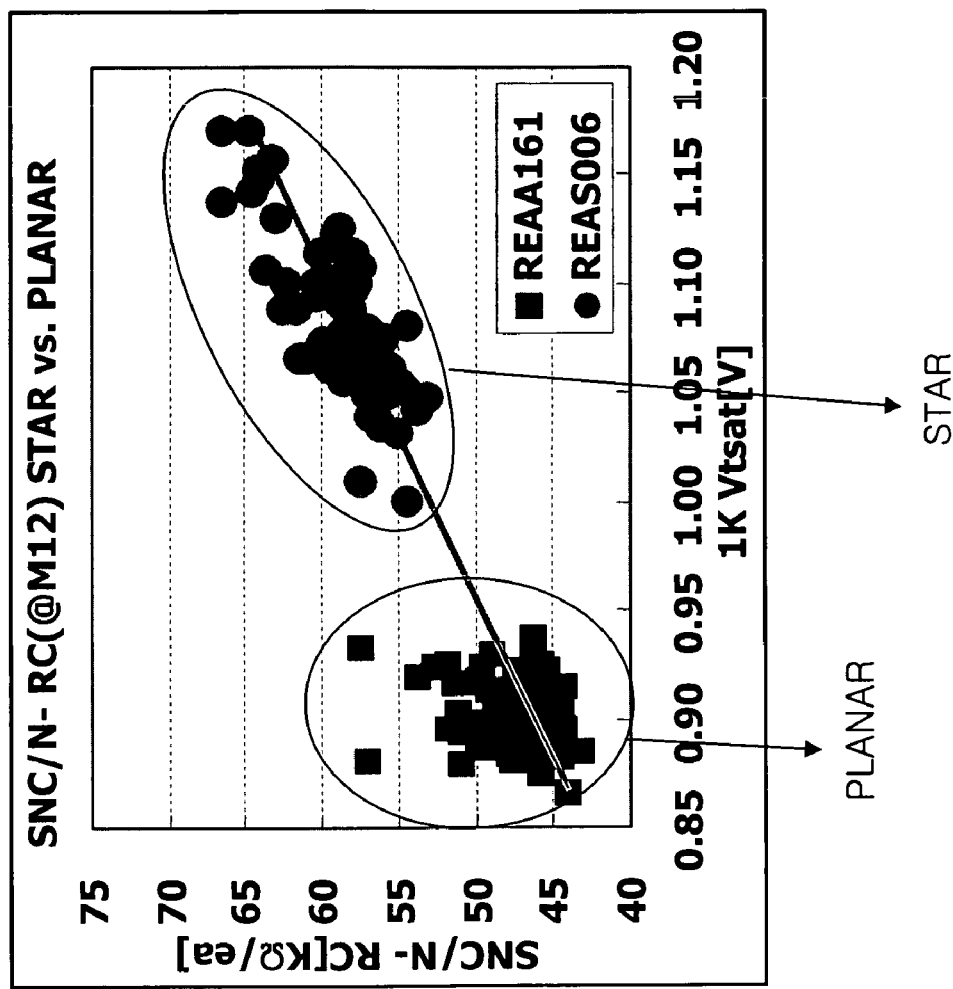
FIGS. 9A and 9B are graphs exhibiting comparison results of SNC/N-contact resistance of devices employing different cell structures.
Figure 9B:
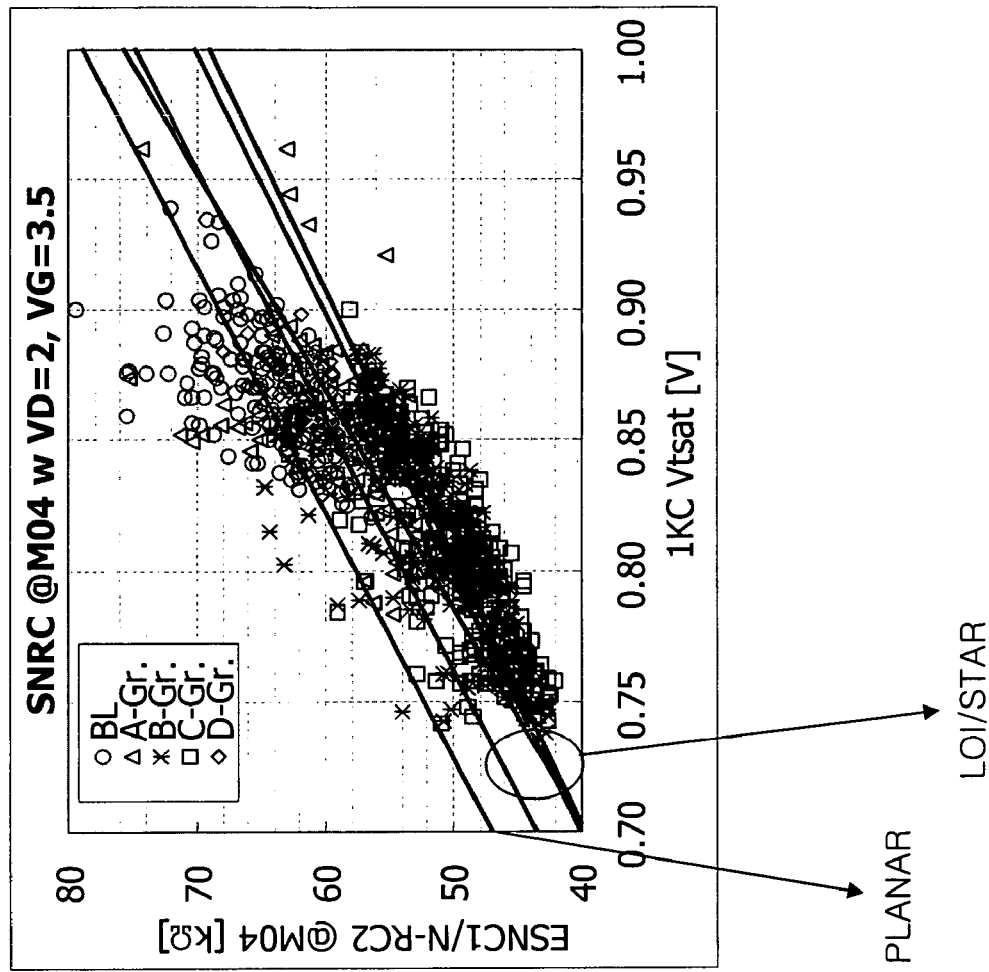

FIGS. 9A and 9B are graphs exhibiting comparison results of SNC/N-contact resistance of devices employing different cell structures. Herein, the SNC/N-contact resistance denotes a contact resistance between a storage node contact (SNC) and a source/drain region (N-).

FIG. 9A is a graph illustrating the comparison results of SNC/N-contact resistance between a STAR type cell and a conventional planar type cell. As shown in FIG. 9A, the STAR type cell has a higher contact resistance than that of the conventional planar type cell.

FIG. 9B is a graph illustrating the comparison results of SNC/N-contact resistance between a LOI/STAR type cell and a conventional planar type cell. The LOI/STAR type cell has a lower contact resistance than that of the conventional planar type cell.

Figure 10:
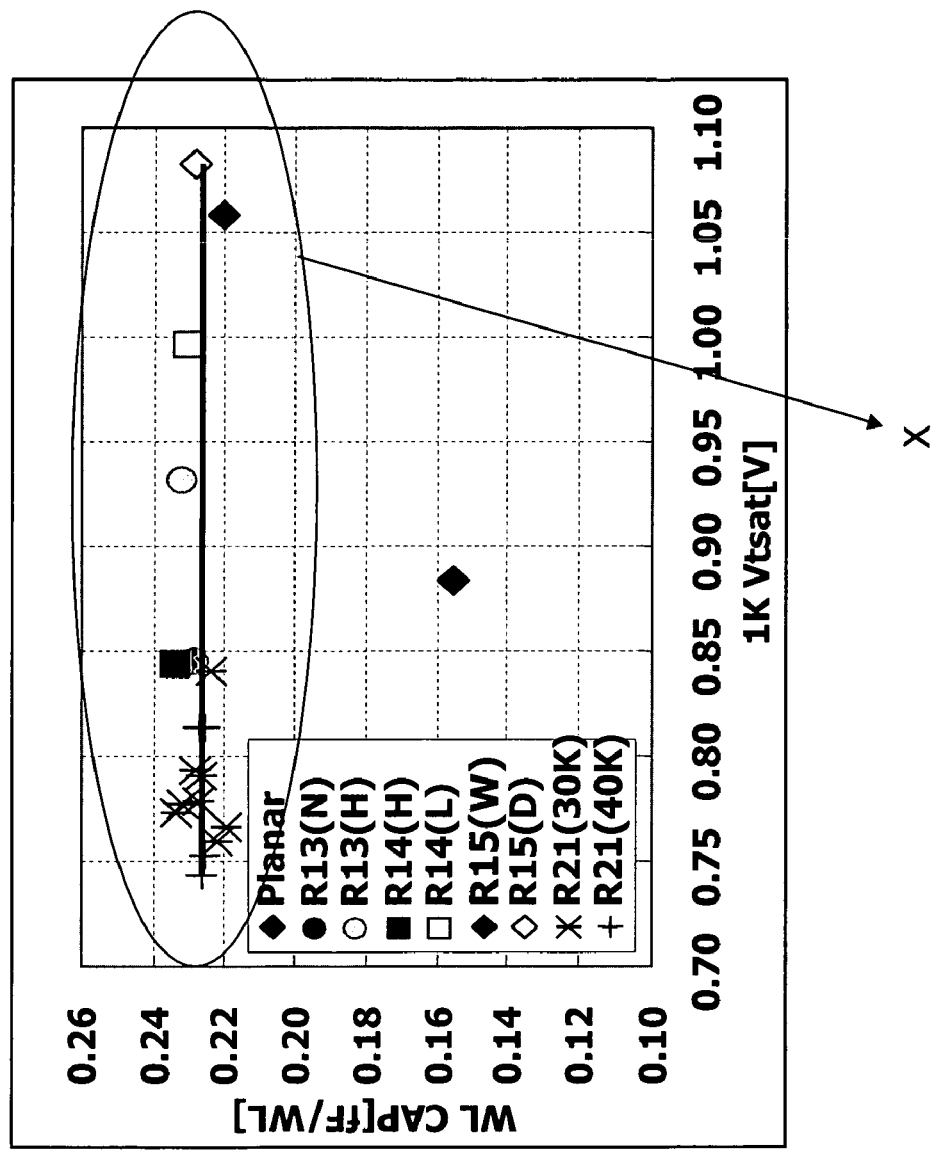
FIG. 10 is a graph exhibiting comparison results of word line capacitance between a recess channel array transistor (RCAT) type cell that does not employ a LOI structure and a conventional planar type cell.

FIG. 10 is a graph exhibiting comparison results of word line capacitance of a RCAT type cell which does not employ a LOI structure and a conventional planar type cell. The RCAT type cell shows higher word line capacitance than that of the conventional planar type cell. A reference denotation X denotes that the word line capacitance is increased during a recess gate formation process.

Figure 11:
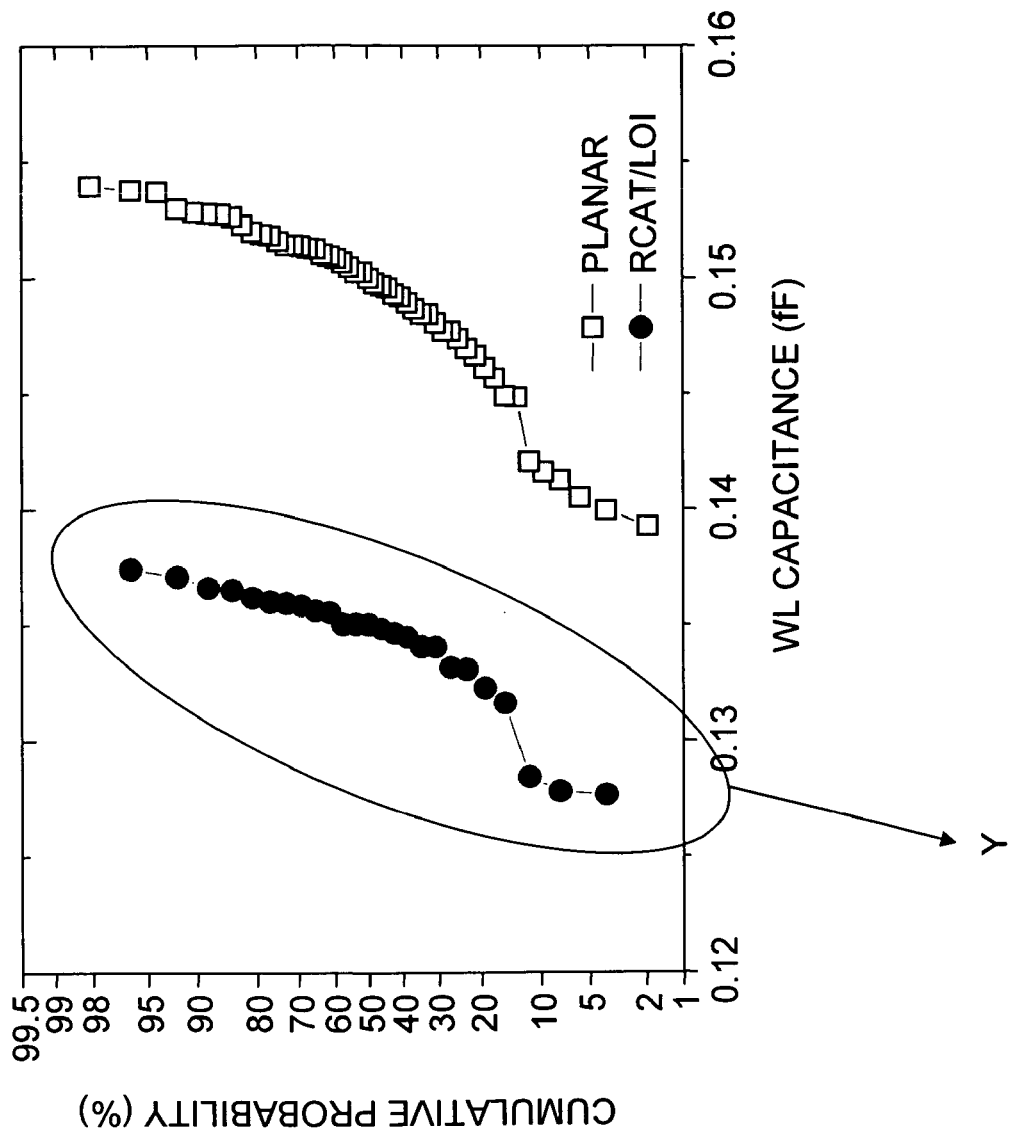
FIG. 11 is a graph exhibiting comparison results of a RCAT type cell employing a LOI structure and a conventional planar type cell.

FIG. 11 is a graph exhibiting comparing results of word line capacitance of a RCAT type cell employing a LOI structure and a conventional planar type cell. The RCAT type cell employing the LOI structure has much lower word line capacitance than that of the conventional planar type cell. A reference denotation Y denotes that the word line capacitance is decreased during a LOI structure formation process.

On the basis of FIGS. 10 and 11, in the case of simply employing the RCAT type cell, the word line parasitic capacitance is increased compared to that of the conventional planar type cell; however, in the case of using the RCAT type cell simultaneously employing the LOI structure, the wore line parasitic capacitance is decreased compared to that of the conventional planar type structure.

In accordance with an embodiment of the present invention, it is possible to not only increase a channel length, but also prevent a reduction in parasitic capacitance, a deep punchthrough between neighboring transistors and a junction leakage by simultaneously employing a STAR structure and a LOI structure, or a RCAT structure and a LOI structure. Accordingly, an embodiment of the present invention may improve a refresh property.

The present application contains subject matter related to the Korean patent application No. KR 2005-0027366 filed in the Korean Patent Office on Mar. 31, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a trench in a device isolation region of a substrate in which the device isolation region and an active region are defined;
    forming a first recess region whose end points extend to the active region at a bottom portion of the trench;
    forming a field oxide layer buried into the first recess region and the trench;
    forming a second recess region by etching a preset portion of the active region to a predecided depth, thereby providing a second active region whose height is lower than that of a first active region; and
    forming a gate pattern on a border region between the first active region and the second active region, wherein the gate pattern has a step structure whose one side extends to a surface of the first active region and the other side extends to a surface of the second active region.

2. The method of claim 1, wherein the forming of the first recess region comprises:
    forming spacers in contact with sidewalls of the trench; and
    forming the first recess region through an isotropic etching process subjected to the bottom portion of the trench by using the spacers as an etch barrier.

3. The method of claim 2, wherein the isotropic etching process is performed with an etching condition in which the end points of the first recess region laterally extend beneath the spacers.

4. The method of claim 3, wherein the isotropic etching process is performed at a pressure ranging from approximately 2 torr to approximately 200 torr, for a period ranging from approximately 0.5 minute to approximately 60 minutes, by using a flowing quantity of hydrogen chloride (HCl) ranging from approximately 0.1 slm to approximately 1 slm and a flowing quantity of hydrogen ($H_2$) ranging from approximately 10 slm to approximately 50 slm, and at an etching temperature ranging from approximately 700° C. to approximately 1,000° C.

5. The method of claim 4, further comprising performing a pre-annealing process, before the isotropic etching process, in a hydrogen atmosphere at a temperature ranging from approximately 800° C. to approximately 1,000° C.

6. The method of claim 2, wherein the forming of the spacers comprises:
    forming a first oxide layer by performing a sidewall oxidation process upon the trench;
    depositing a liner nitride layer on the first oxide layer;
    forming a second oxide layer on the liner nitride layer through a liner oxidation process; and
    performing an etch-back process upon the second oxide layer, the liner nitride layer and the first oxide layer.

7. The method of claim 1, wherein a recessed depth of the second recess region ranges from approximately 200 Å to approximately 600 Å.

8. A method for fabricating a semiconductor device, comprising:
    forming a trench in a device isolation region of a substrate in which the device isolation region and an active region are defined;
    forming a first recess region whose end points laterally extend to the active region at a bottom portion of the trench;
    forming a field oxide layer buried into the first recess region and the trench;
    forming a second recess region by etching a predetermined portion of the active region to a predecided depth; and
    forming a recess gate pattern whose bottom portion is buried into the second recess region and top portion projects above a surface of the active region.

9. The method of claim 8, wherein the forming of the first recess region comprises:

forming spacers in contact with sidewalls of the trench; and forming the first recess region through an isotropic etching process applied to the bottom portion of the substrate by using the spacers as an etch barrier.

10. The method of claim 9, wherein the isotropic etching process is performed with an etching condition in which the end points of the first recess region laterally extend beneath the spacers.

11. The method of claim 10, wherein the isotropic etching process is performed at a pressure ranging from approximately 2 torr to approximately 200 torr, for a period ranging from approximately 0.5 minute to approximately 60 minutes, by using a flowing quantity of hydrogen chloride (HCl) ranging from approximately 0.1 slm to approximately 1 slm and a flowing quantity of hydrogen ($H_2$) ranging from approximately 10 slm to approximately 50 slm, and at an etching temperature ranging from approximately 700° C. to approximately 1,000 ° C.

12. The method of claim 9, further comprising a pre-annealing process, performed before the isotropic process, in a hydrogen atmosphere at a temperature ranging from approximately 800° C. to approximately 1,000° C.

13. The method of claim 9, wherein the forming of the spacers comprises:

forming a first oxide layer by performing a sidewall oxidation process upon the bottom portion of the trench;

depositing a liner nitride layer on the first oxide layer;

forming a second oxide layer on the liner nitride layer through a liner oxidation process; and performing an etch-back process to the second oxide layer, the liner nitride layer and the first oxide layer.

14. The method of claim 8, wherein a recessed depth of the second recess region ranges from approximately 200 Å to approximately 600 Å.

* * * * *